United States Patent
Maul et al.

(10) Patent No.: US 8,025,427 B2
(45) Date of Patent: Sep. 27, 2011

(54) FILTER DEVICE FOR THE COMPENSATION OF AN ASYMMETRIC PUPIL ILLUMINATION

(75) Inventors: Manfred Maul, Aalen (DE); Damian Fiolka, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 12/855,305

(22) Filed: Aug. 12, 2010

(65) Prior Publication Data

US 2010/0309450 A1   Dec. 9, 2010

Related U.S. Application Data

(62) Division of application No. 11/722,631, filed as application No. PCT/EP2005/009165 on Aug. 25, 2005, now Pat. No. 7,798,676.

(30) Foreign Application Priority Data

Dec. 23, 2004   (DE) .................. 10 2004 063 314

(51) Int. Cl.
*F21V 9/00* (2006.01)
*G03B 27/68* (2006.01)
(52) U.S. Cl. .......................... 362/293; 355/67
(58) Field of Classification Search .......... 362/293, 362/583; 355/53, 67
See application file for complete search history.

(56) References Cited

U.S. PATENT DOCUMENTS

| 4,598,197 | A | 7/1986 | Morita et al. |
| 5,392,094 | A * | 2/1995 | Kudo ............................. 355/67 |
| 5,461,456 | A | 10/1995 | Michaloski |
| 5,675,401 | A | 10/1997 | Wangler et al. |
| 5,731,577 | A | 3/1998 | Tanitsu |
| 5,829,868 | A | 11/1998 | Hutton |
| 6,236,449 | B1 | 5/2001 | Tanitsu |
| 6,333,777 | B1 | 12/2001 | Sato |
| 6,535,274 | B2 | 3/2003 | Antoni |
| 6,538,716 | B2 * | 3/2003 | Mulkens et al. ............... 355/67 |
| 6,636,367 | B2 | 10/2003 | Drodofsky et al. |
| 6,733,165 | B2 | 5/2004 | Van Der Lei et al. |
| 6,741,329 | B2 | 5/2004 | Leenders et al. |
| 6,769,792 | B1 | 8/2004 | Bornhorst |

(Continued)

FOREIGN PATENT DOCUMENTS

DE    101 51 309    5/2003

(Continued)

OTHER PUBLICATIONS

International Preliminary Report on Patentability dated Jun. 26, 2007 for PCT/EP05/009165 (7 pages).

(Continued)

*Primary Examiner* — David V Bruce
(74) *Attorney, Agent, or Firm* — Fish & Richardson P.C.

(57) ABSTRACT

The invention relates to a filter device for an illumination system, especially for the correction of the illumination of the illuminating pupil, including a light source, with the illumination system being passed through by a bundle of illuminating rays from the light source to an object plane, with the bundle of illuminating rays impinging upon the filter device, including at least one filter element which can be introduced into the beam path of the bundle of illuminating rays, with the filter element including an actuating device, so that the filter element can be brought with the help of the actuating device into the bundle of illuminating rays.

21 Claims, 11 Drawing Sheets

U.S. PATENT DOCUMENTS

| | | |
|---|---|---|
| 6,985,218 B2 | 1/2006 | Dieckman |
| 7,283,209 B2 | 10/2007 | Brotsack |
| 2003/0076679 A1 | 4/2003 | Oskotsky et al. |
| 2004/0012766 A1 | 1/2004 | Tanitsu |
| 2004/0257559 A1 | 12/2004 | Dieckmann |

FOREIGN PATENT DOCUMENTS

| | | |
|---|---|---|
| EP | 0 747 772 | 12/1996 |
| EP | 0 849 637 | 9/1998 |
| EP | 0 867 772 | 9/1998 |
| EP | 1 291 721 | 3/2003 |
| EP | 1 349 009 | 3/2003 |
| EP | 1 372 040 | 12/2003 |
| WO | WO 03/046663 | 6/2003 |

OTHER PUBLICATIONS

Written Opinion of the International Searching Authority for PCT/EP05/009165 (5 pages).

* cited by examiner

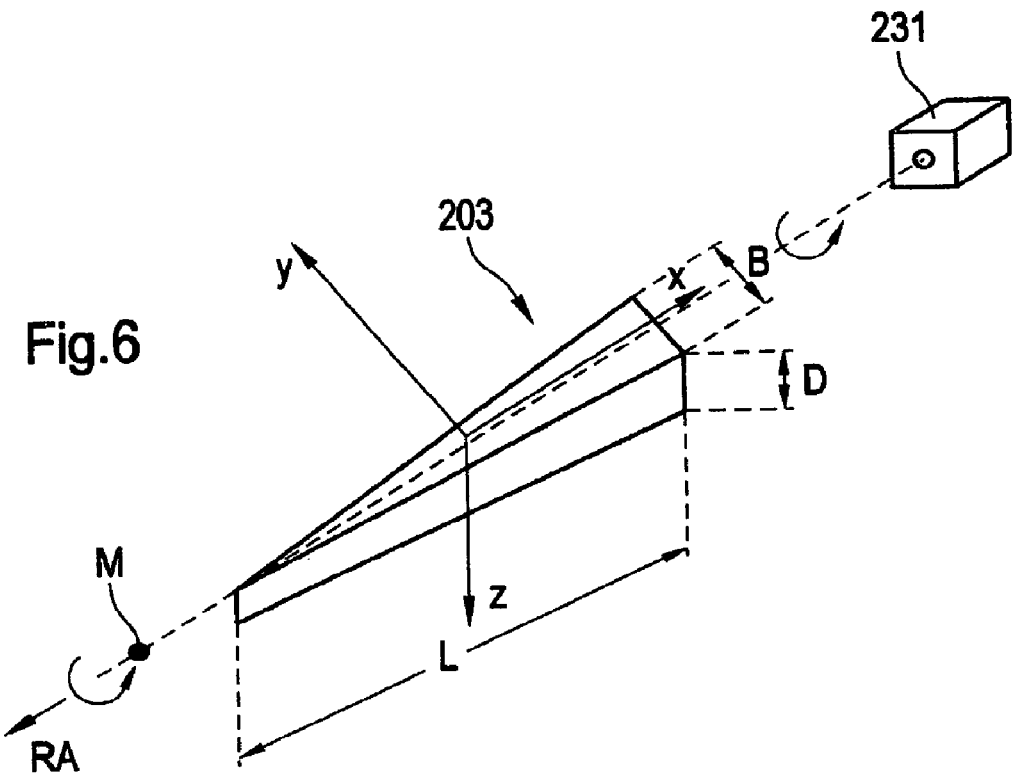
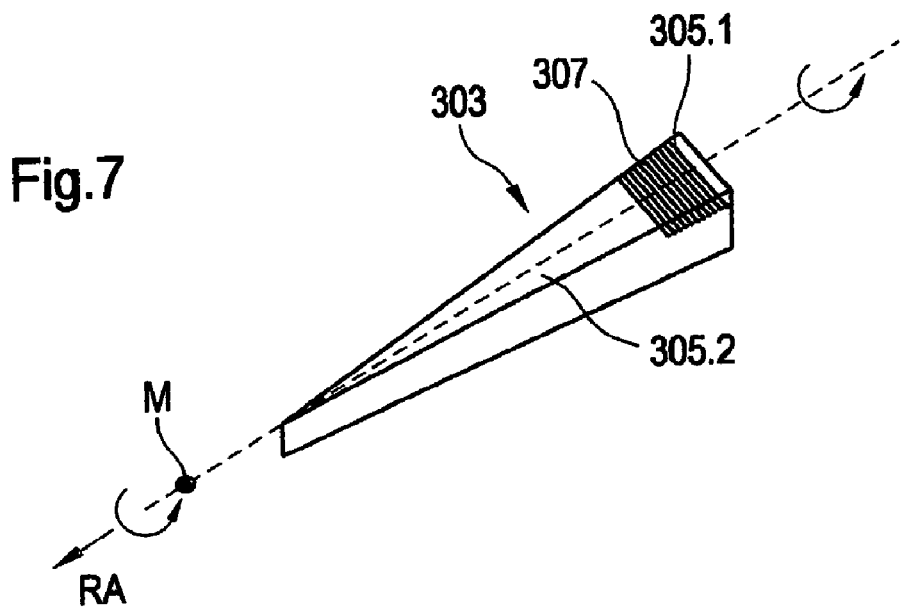

FILTER DEVICE FOR THE COMPENSATION OF AN ASYMMETRIC PUPIL ILLUMINATION

CROSS-REFERENCE TO RELATED APPLICATIONS

This application is a divisional of U.S. application Ser. No. 11/722,631, filed Sep. 5, 2007, now U.S. Pat. No. 7,798,676 which is a National Stage of International Application No. PCT/EP05/009165, filed Aug. 25, 2005, which claims benefit of German Application No. 10 2004 063 314.2, filed Dec. 23, 2004. The contents of U.S. application Ser. No. 11/722,631 are hereby incorporated by reference in its entirety.

BACKGROUND OF THE INVENTION

1. Field of the Invention

The invention relates to a filter device for the compensation of an asymmetric pupil illumination of an illumination system, especially for an illumination system associated with a lithographic system.

2. Description of the Related Art

High demands are placed on illumination systems for lithographic systems for producing microelectronic or micromechanical components. This relates both to systems which work as wafer stepper or as wafer scanner. Such an illumination system must illuminate an object, which is typically a mask, in a field plane of the illumination system in a homogeneous manner. In addition to this requirement, there is also a demand for the angular distribution of the illumination in the field plane, which on its part is associated with the illumination of the exit pupil of the illumination system. For a lithographic system, the exit pupil of the illumination system coincides with the entrance pupil of a downstream projection objective. That is why it is necessary to arrange the illumination characteristics of the exit pupil in an adjusted manner in order to introduce the largest possible amount of light into the projection objective, to fulfill the requirement of telecentricity in the image plane of the projection system and in order to achieve the most even possible imaging of the mask structures.

For evening the illumination of a field in the field plane, illumination systems are known in which a rod-like optical integrator is used. Depending on the operating wavelength, the material of such a rod-like optical integrator is adjusted. It can consist for example of quartz glass or a crystalline material such as calcium fluoride. The effect of such a rod-like optical integrator is disclosed for example in U.S. Pat. No. 5,675,401, U.S. Pat. No. 2004/012766, EP 0867772, U.S. Pat. No. 6,236,449 or EP 0747772. It provides that as a result of the plurality of total reflections of the light coupled into the rod-like optical integrator, a thorough mixture of the illumination light is achieved on its outside surfaces. The total reflection is not completely without losses due to the residual roughness of the surfaces of the rod jacket.

An undesirable asymmetry of the illumination of the exit pupil occurs in scanners due to the rectangular cross section when using rod-like optical integrators. Light rays which extend predominantly parallel to the narrow side are reflected more frequently and are therefore attenuated more strongly. This asymmetry leads to an energetically elliptic pupil profile and is referred to below as ellipticity. In order to avoid an asymmetry of the illumination, a rod-like optical integrator is known from U.S. Pat. No. 6,733,165 which has such an aspect ratio between width and height, that the number of reflections and thus the total reflection losses on its side surfaces are set in such a way that a predetermined distribution of the luminous energy is produced in the angular space on the output surface of the glass rod. The disadvantageous aspect in this solution according to U.S. Pat. No. 6,733,165 is that only elliptical asymmetries can be corrected.

Furthermore, adjustable symmetric pupil filters are known. U.S. Pat. No. 6,535,274 for example discloses a filter arrangement in which at least two symmetrical filter elements are turned against each other and an adjustable, but symmetrical, intensity filter for filtering the pupil illumination is realized. Pupil filters which are disclosed in U.S. Pat. No. 6,535,274 allow producing or correcting an ellipticity of the distribution of the illumination angle in the object plane by setting the respective transmission in the area of the pupil plane of the illumination system of a projection exposure system. The correction of a complex asymmetry is not possible.

U.S. Pat. No. 6,636,367 shows an illumination system in which changes in the distribution of the angle of illumination can be made through controlled movement of the pupil filter which is arranged in the region of the pupil plane. The pupil filter is arranged as a rotatable element which has a transmission distribution which is non-rotation-symmetric about the rotational axis. Ellipticity can thus also be set in combination with a rod as an integrator.

From US 2003/0076679 an illumination system is known which includes at least one diffraction grating in the light path from the light source to the plane in which the structure-bearing mask is arranged. The diffraction grating is used to reflect light at different angles relative to the optical axis.

Illumination systems have further become known with an optical integrator in the light path from the light source to the plane in which a structure-bearing mask is arranged, e.g. from U.S. Pat. No. 5,731,577, U.S. Pat. No. 5,461,456, U.S. Pat. No. 6,333,777 or EP 0849637.

The optical integrators according to U.S. Pat. No. 5,731,577, U.S. Pat. No. 5,461,456, U.S. Pat. No. 6,333,777 or EP 0849637 includes facetted elements.

Field filters are further known for improving the uniformity of the illumination of a field in the field plane, i.e. filter devices which are positioned closer to a field plane than a pupil plane of the illumination system. EP 1 291 721 discloses a field filter in which the orientation of lamellae-like elements can be set substantially in the ambient environment of the field plane and thus a local blockade effect in the beam path can be achieved. This filter does not allow however correcting the angular spectrum of the illumination of the field plane and thus an asymmetry concerning the intensity of the illumination of the exit pupil of the illumination system.

The disadvantageous aspect in all filter elements known from the state of the art is that they are limited to the correction of certain asymmetries or asymmetric aberrations of the pupil, e.g. to the correction of elliptical asymmetries. The known pupil filters are not suitable for correcting complex asymmetries or asymmetric aberrations in the pupil illumination.

What is needed in the art is a pupil filter with which the disadvantages of the state of the art can be overcome and with which it is especially possible with the pupil filter in accordance with the invention to correct any asymmetry of the illumination of an exit pupil or a pupil conjugated to the exit pupil. This relates especially to illumination systems in which the asymmetries occur in the illumination of the exit pupil which include not only elliptical portions.

SUMMARY OF THE INVENTION

In accordance with the present invention, a filter device associated with the exit pupil includes a plurality of filter elements, with each of these filter elements projecting substantially in the radial direction into the beam path of a bundle of projecting rays which passes through the illumination system from the light source to the plane in which a structure-bearing mask such as a reticle is arranged and thus produces a shadow effect. The degree of the blockade effect, i.e. the shading in the beam path of the light, can be set individually for each filter element.

A crown-like arrangement of the filter elements is possible, meaning that they are introduced from the outside circumference of the beam path in the direction towards the center of the beam path. The shadow effect can be produced either by setting the insertion depth in the radial direction or by an orientation of the asymmetrically formed filter elements in the beam path.

It is further possible that the filter device does not influence the pupil size and thus the σ-value of the illumination of the exit pupil. This is achieved in such a way that the filter elements are chosen with respect to their dimension and arrangement density in such a way that the maximum shadow width of each filter element is only 1 to 5% of the distance between two filter elements in the region of the outside circumference of the beam path. It follows from this that the filter elements are provided with a rod-like configuration, i.e. their lateral dimensions are typically smaller than the dimensions in the radial direction, i.e. the direction of insertion into the beam path. On the other hand, the preferred dimensions of the filter elements must be chosen in such a way that each filter element influences the pupil illumination in a certain local area. Local area shall be understood as a number of percent of the pupil surface. In order to achieve the highest possible adjusted correction of the asymmetry of the exit pupil of the illumination system, a filter device with more than 20 filter elements can be used.

In addition to the possibility as already explained above to determine the local shading effect of a filter element by setting the insertion depth in the radial direction into the beam path, an additional or alternative possibility is to configure a filter element in an asymmetric fashion, e.g. in the form of a lamella, and to control the angle of incidence, i.e. the orientation, of the filter element in the beam path. The filter elements can be configured as triangular thin paddles. They can then be oriented in two extreme positions. On the one hand, the beam of the beam path will only impinge on the narrow side of the triangular paddle. In this case the blockade effect and thus also the shadow casting is minimized by the filter element. On the other hand, the paddle can also be turned completely into the beam path, as a result of which the shadow casting is maximized. The triangular shape which can taper in an acute angle is used to successively reduce the blockade effect by the filter element in the direction of the center of the beam path. The setting of the shadow casting via the orientation of the filter element can also be combined with the setting of the radial insertion depth.

In the configuration of the outer form it is possible to provide the filter element with partial transparency at least in partial areas or to provide the same as an unsupported net structure. In the geometrical configuration there is thus freedom to configure a filter element in such a way that by setting the radial insertion depth and its orientation the local shading effect can be adjusted as individually as possible. The actuating elements for achieving the desired setting and orientation can be chosen at the discretion of the person skilled in the art. This can be achieved for example by stepper motors, piezoelectric elements or slip-stick drives. In addition, the entire device can be provided with a configuration which is rotatable about its center in order to compensate the location-discrete effect caused by the limited number of actuating elements.

The filter device can be arranged in such a way in the ambient environment of the exit pupil or a pupil conjugated with the exit pupil in the illumination system that at least part of the shadow casting of the filter elements in the pupil plane has the effect of a partial shadow. The desired influence on the asymmetrical properties of the pupil illumination can thus be achieved in the most precise possible way and with little side-effects on other pupil parameters such as the size. The maximum distance of the filter device to the pupil plane is chosen in such a way that the partial shadow of a filter element reaches the circumferential region of the beam path at most up to the center of the partial shadow of the adjacent filter elements. It follows from this that the maximum distance is influenced by the predetermined angular distribution in the pupil illumination.

A larger distance chosen beyond this threshold would lead to the effect that the partial shadow regions which can be associated to an individual filter element would reach into the partial shadow region of the one but next filter element, and thus an individual adjustment of the asymmetry correction would become more difficult. In the present application, a region $\Delta z$ in the direction of the light is understood as being close to the pupils, which region fulfills the condition that the partial shadows of the individual filter elements overlap half at most in the circumferential region of the beam path. The filter element is arranged close to the pupil in the case when it lies within the region $\Delta z$.

The limits of the region $\Delta z$ are predetermined on the one hand by the pupil plane per se and on the other hand by the maximum distance $\Delta z_{MAX}$. The maximum distance $\Delta z_{MAX}$ is a distance from the pupil plane in which the partial shadows of the respective one but the next filter elements just contact each other in the circumferential region of the beam path.

The partial shadows of the individual filter elements are created by shadow casting. Shadow casting shall be understood in this application as the shadings occurring in a plane arranged directly behind the pupil filter.

In a second aspect of the invention, a filter device for an illumination system is provided which includes at least one filter element which can be introduced into the illumination beam path of an illumination system in different positions, with the filter element including a sensor for determining the intensity values. The sensors allow the measurement of intensity values in the illumination beam path along the filter element in a position-resolved way. The influence of the filter element on the illumination properties (i.e. the illumination in a field plane of the illumination system) can be obtained from the measured intensity values of the filter element. With the help of the filter element in accordance with the invention, it is possible to measure ellipticity, telecentricity and transmission of the illumination as illumination properties of the illumination.

The measured intensity values can be read into a control device and can be compared for example with the setpoint values of an illumination to be achieved in the field or pupil plane. These setpoint values lead to setpoint positions for the filter element to achieve the illumination in the field and/or pupil plane. If the filter device with the filter elements is used as a pupil filter, a comprehensive calibration of the filter element is thus avoided by such a further developed embodiment. Such a calibration is necessary because the configuration of the filter device depends very strongly on the illumination mode, especially the position of the filter elements for achieving a certain illumination in the field and/or pupil plane. The type of illumination is designated as the illumination mode, e.g. an annular or quadropolar illumination. Moreover, a precise adjustment of the filter apparatus with respect to the illumination system is no longer required in order to ensure that the actuating positions as measured on delivery are still valid even after the installation of the correction system or when and it is exchanged at the customer's location.

The sensors for determining the intensity values can be configured as power sensors, e.g. photodiode sensors. The sensors can be arranged at one end of a filter element configured in the form of a rod.

The sensors can be connected with a control device in such a way that signals can be exchanged via electric lines or radio link between the sensors and the control device.

If the sensor is arranged as described above at one end of a rod-like filter element, the light intensity which is absorbed by the insertion of the rod-like filter element into the illumination beam path is determined by integration of the measured values which are determined when the rod-like filter element is moved in a quasi continuous way from a certain position outside of the illuminated region into the same and the intensity is measured depending on the position of the sensor.

In a second, further developed embodiment a rod-like filter element can be covered completely with quasi punctiform energy sensors, e.g. photodiode sensor lines or CCD (Charge-Coupled Device) lines. This embodiment has the advantage that the measurement of the absorbed intensity which depends on the location of the rod-like filter element can occur when the filter element is moved into the illuminating beam path.

A successive insertion as in a rod-like filter element with only one sensor attached to the end of the rod-like element is not necessary.

Since the energy sensors are only needed for determining the exact position of the filter element, it is provided for in a further developed embodiment in order to protect the sensors from permanent radiation by the same illumination mode that the filter element is rotatable about its own axis in order to position the sensors in the shadow of the filter element by rotating the filter element by 180° after the performed measurement and thus to protect the sensors from damage.

If the filter element, and especially the rod-like filter element in a further developed embodiment as described above, is provided with sensors, it is possible to measure the share of light as absorbed by the filter element in a location-resolved way with respect to a freely chosen but fixed system of coordinates along the filter element. Based on this information it is possible to perform a calculation of the setpoint position of the filter element for the set illumination mode in order to thus obtain the desired state of corrections of field and/or pupil illumination. In the case of a field correction, the individual filter elements are moved into the light distribution in the field for correcting the scan-integrated intensity.

By attaching sensors to the filter element, it is further possible to also determine the edge of the pupil in that the edge is measured in the transition of the sensor into the illuminated area.

This enables a very precise adjustment of the correction unit relative to the illumination system.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 6 shows a three-dimensional view of a rotatable filter element;

FIG. 7 shows a three-dimensional view of a filter element with a transparent region;

FIG. 8b shows the shadings in detail for a projection exposure system according to FIG. 8a;

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 1:
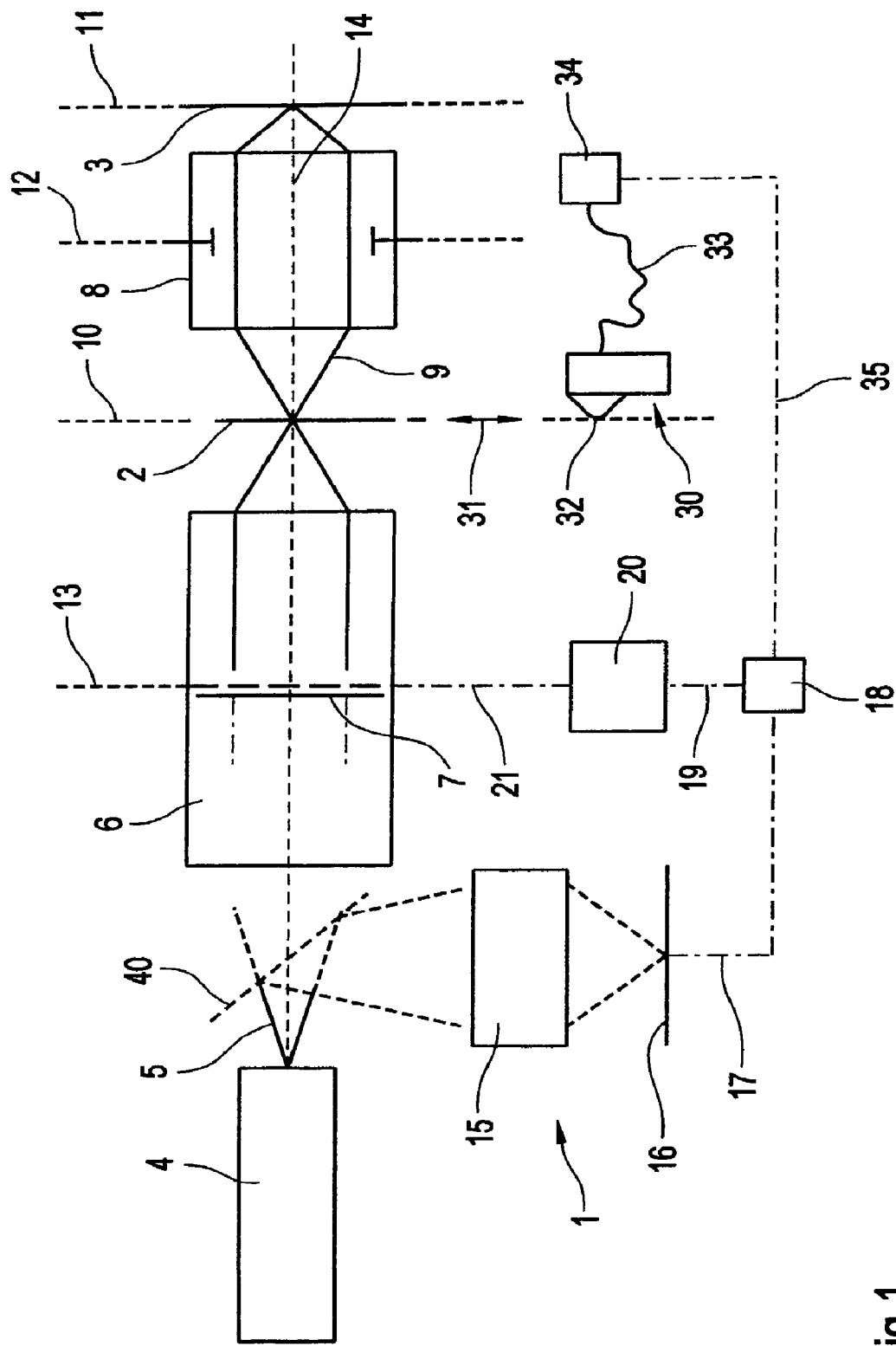
FIG. 1 shows a schematic overview of a projection exposure system.

Referring now to the drawings, and more particularly to FIG. 1, there is shown a projection exposure system for microlithography which is designated in its entirety with reference numeral 1. The projection exposure system is used for transmitting a structure on a reticle 2 onto the surface of a wafer 3. The light source for the projection exposure system 1 is a UV laser 4, e.g. an ArF excimer laser with a wavelength of 193.3 nm. A bundle of illumination rays emitted by the same meets at first the illuminating optics 6. The beam path of the bundle 5 of illuminating rays is only indicated between the UV laser 4 and the illuminating optics 6 for reasons of clarity of the illustration. The illuminating optics 6 are shown in FIG. 1 only schematically in the form of a block and can include a number of optical modules such as a zoom objective, diffractive optical elements or an optical integrator for homogenizing the bundle 5 of illuminating rays.

When passing through the illuminating optics 6, the bundle 5 of illuminating rays passes through a filter device which is arranged in or close to a pupil plane 13 and which will be designated below as pupil filter 7. The pupil filter is configured in accordance with the invention and will be described below in closer detail. In the present embodiment, the pupil filter 7 is arranged before the pupil plane 13. The position of the pupil filter 7 is also referred to below as the filter plane. The bundle 5 of illuminating rays then illuminates the reticle 2. The structures of the reticle 2 are projected with the help of projection optics 8 onto the surface of the wafer 3. The projection optics 8 can be composed of a plurality of lenses and/or mirrors.

A selected bundle of projection light which passes a central object point on the reticle 2 and is guided with the projection optics 8 is provided in FIG. 1 with the reference numeral 9 and is extended a bit into the opposite direction for clarifying the path of the projection rays, i.e. in the direction towards and into the illuminating optics 6. The reticle 2 lies in the object plane 10 of the projection optics 8 which is indicated in FIG. 1 by a broken line. The wafer 3 lies in an image plane 11 of the projection optics 8 which is also indicated by a broken line. A pupil plane 12 of the projection optics 8 is also schematically indicated in FIG. 1. It is conjugated in the illuminating optics 6 relative to the pupil plane 13. The pupil plane 12 is also designated as the entrance pupil of the projection optics 8.

The optical axis of the projection exposure system 1 is also indicated in FIG. 1 with the broken line and provided with reference numeral 14. A partly transparent optical plate 40 is arranged in the illustrated embodiment of a projection exposure system in the beam path between the UV laser 4 and the illuminating optics 6, which plate reflects a small portion of the bundle 5 of illuminating rays and transmits the predominant portion (which is usually more than 99%) of this luminous bundle. The beam path of the bundle 5 of illuminating rays which passes through the optical plate 40 is only continued a small amount because it is not of further interest.

The reflected portion of the bundle 5 of illuminating rays after the optical plate 40 which is also shown in a broken line is projected onto a two-dimensional CCD array 16 by way of projection optics 15. The CCD array is in connection with a control device 18 via a signal line 17 shown in a dot-dash line. The control device 18 controls a drive device 20 via a signal line 19 which is also shown in a dot-dash line. The drive device 20 can drive the pupil filter 7 or individual elements of the pupil filter for asymmetry correction via a drive connection 21 which is also shown in a dot-dash line.

A detection device 30 which can be used alternatively or in addition to the CCD array 16 for measuring the distribution of the illuminating intensity and illuminating angle of the projection bundle 9 in the object plane 10 is shown in FIG. 1 in an inactive position outside of the path of the projection rays. The detection device 30 can be moved into the beam path of the optics by way of a drive device (not shown) perpendicularly to the optical axis 14 (as illustrated by the double arrow 31) after the removal of the reticle 2 in such a way that an entrance opening 32 lies in the object plane 10 through which a projection bundle (e.g. projection bundle 9) usually illuminating the reticle can enter the interior of the detection device 30.

The detection device 30 is connected via a flexible signal line 33 with a control device 34 which on its part is in connection with the control device 18 by a signal line 35 shown with a dot-dash line.

It can be provided for in a further alternative embodiment of the invention that the detection device 30 be provided for measuring the illuminating intensity in the image plane 11 of the projection optics 8 in which the wafer is also arranged.

FIGS. 2 to 7 show below the configuration of an embodiment of a filter apparatus which can be used as a pupil filter 7 for the correction of asymmetry.

Figure 2:
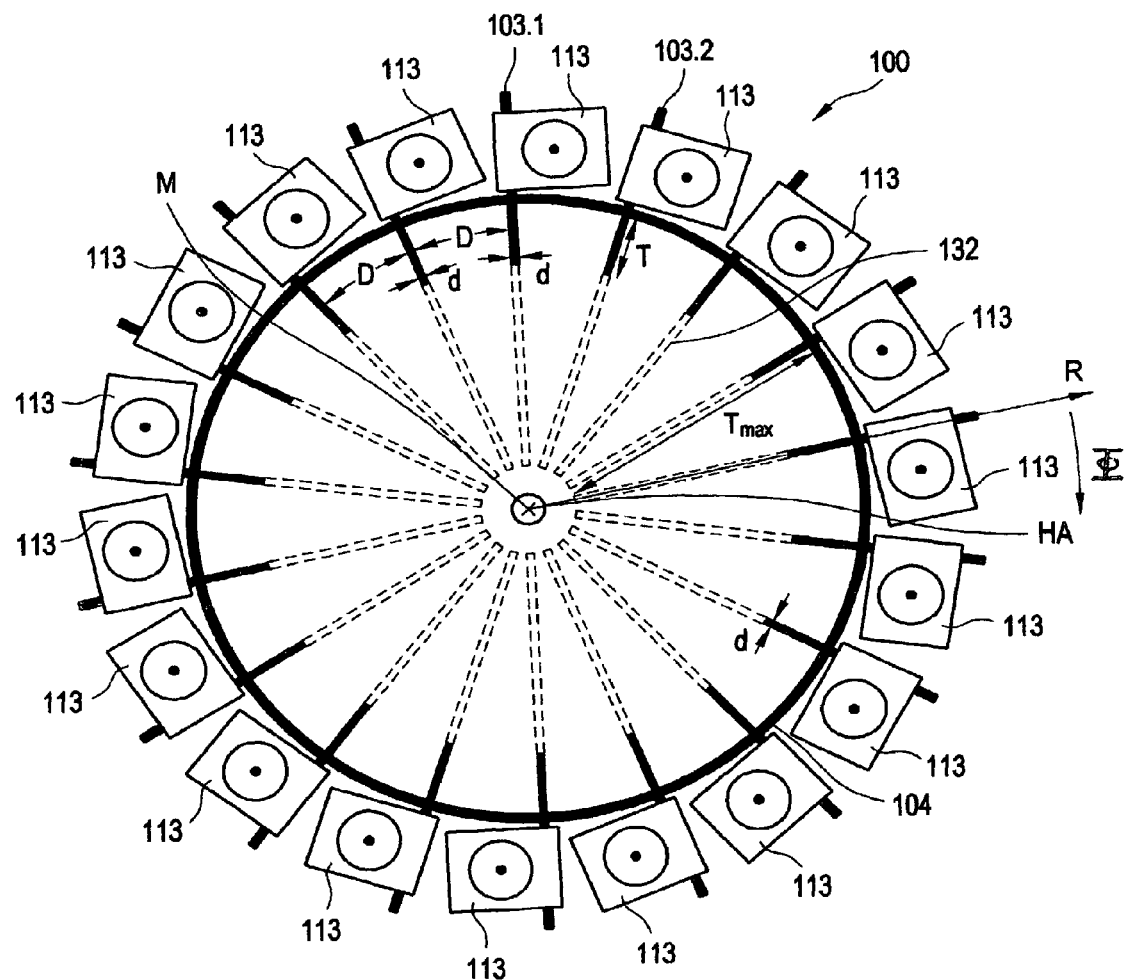
FIG. 2 shows an arrangement of radially displaceable filter elements of a pupil filter in accordance with the invention.

FIG. 2 shows a first embodiment of a filter apparatus of the pupil filter 100. It includes filter elements that are individually adjustable. The filter device can be arranged in the vicinity of the exit pupil or a pupil conjugated to the exit pupil. The individual filter elements can intervene from the outside into the beam path. Each of the filter elements 103 is provided in the present embodiment with the rod-like configuration. Its dimensions in an azimuthal direction which stands perpendicular to the radial direction are clearly smaller than the radial extension of the filter elements 103.

In the pupil filter 100 as shown in FIG. 2, the radial direction R and the azimuthal direction φ are entered.

In a first embodiment of the invention the filter elements 103 are inserted depending on the required correction of asymmetry from the outside circumference 104 of the filter device 100 in the direction towards the optical axis HA of the beam path. In the illustrated embodiment however, the direction of insertion of the filter element 103 coincides with the radial direction R. Moreover, the dimensions d of the filter elements 103 are chosen preferably smaller in the azimuthal direction φ than the distance D between two single adjacent filter elements 103.1, 103.2. The distance in the region of the outside circumference 104 of the filter device 100 is regarded as the distance D of two filter elements 103.1, 103.2. A lateral extension d of 1 to 5% of the distance D of the filter elements with respect to each other is especially preferable, i.e. when the distance D of a first filter element 103.1 from the adjacent second filter element 103.2 is 100 mm, then the width d of the individual filter elements 103.1, 103.2 is 1 mm to 5 mm. When choosing such a dimensioning, the desired local intensity adjustment for the correction of asymmetry of the pupil illumination can be adjusted by way of the individual settings of the filter elements 103.1, 103.2 of the filter device without this having influence on the pupil size per se.

Figure 4:
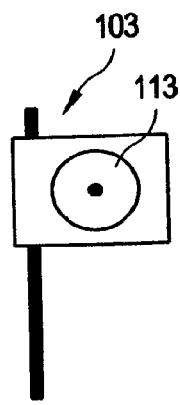
FIG. 4 shows a single filter element.

In the embodiment of the invention as shown in FIG. 2, the pupil illumination is corrected or set in such a way that every single filter element 103 can be inserted to a differently large extent in the radial direction R into the filter device. In order to enable setting the insertion depth individually in the radial direction each filter element 103 is associated with an actuating element 113. This actuating element 113 can be used for separately setting the insertion depth T in the radial direction R into the beam path for each filter element. FIG. 4 shows an individual rod-like filter element 103 in conjunction with an actuating element 113 which includes a drive for a linear movement, i.e. a displacing movement in the radial direction R of the filter device 100. It is understood that also embodiments of the invention are possible in which only a part of the filter elements includes an actuating element for displacement in the radial direction and another part is provided with a fixed configuration.

In the filter device 100 as shown in FIG. 2, the maximum depths $T_{MAX}$ are shown with the dot-dash line 132 by which the individual filter elements 103 can be displaced in the radial direction towards the center M of the filter device 100, especially the pupil filter.

As is shown in FIG. 2, the maximum depths $T_{MAX}$ are chosen in such a way that they nearly reach the optical axis HA of the beam path as shown in the present embodiment. It is possible that the individual filter elements 103 neither overlap nor touch each other when they have been displaced up to the maximum depth $T_{MAX}$ into the filter device 100. The shadings that can be set at most are predetermined for each of the filter elements 103 by the maximum depth $T_{MAX}$.

Figure 3:
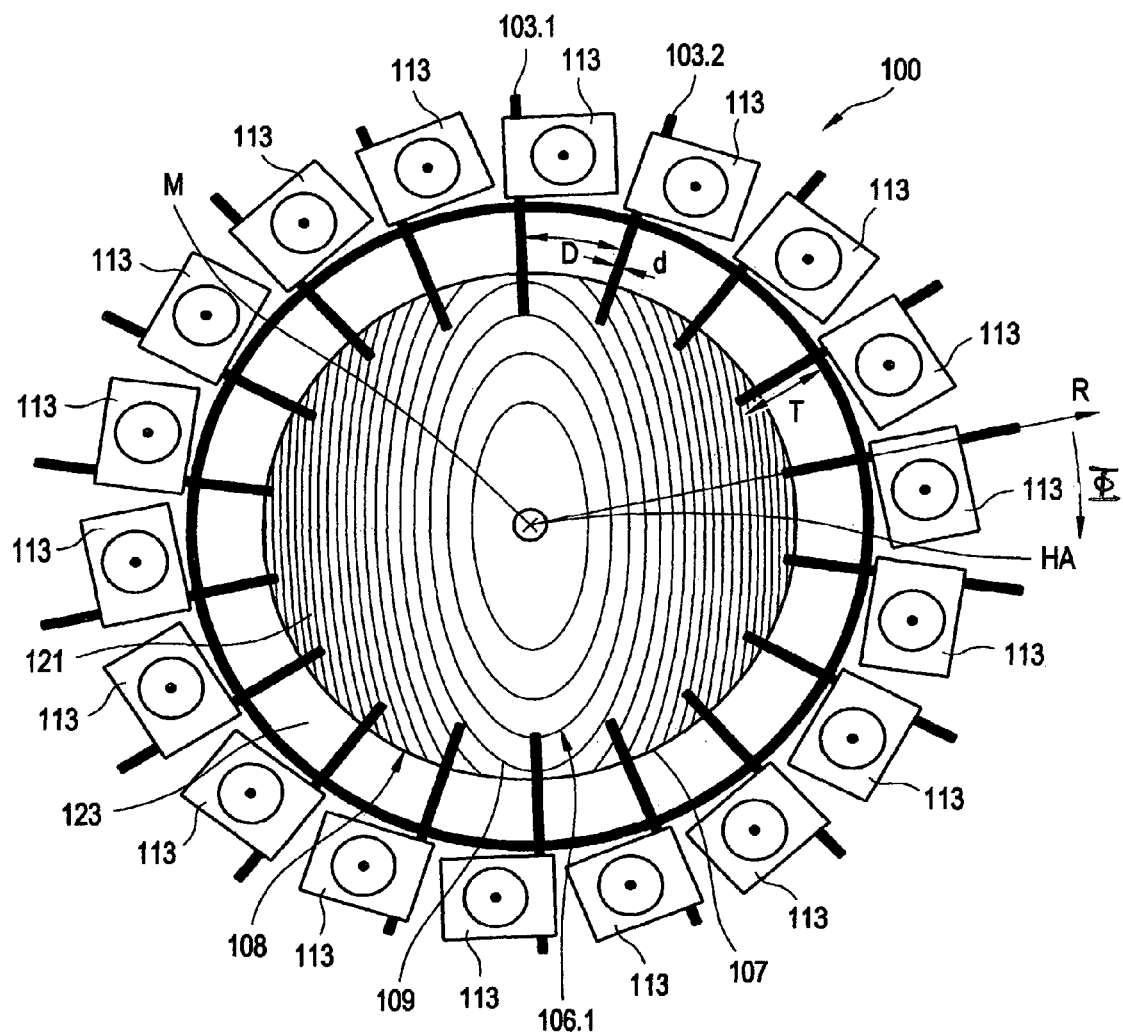
FIG. 3 shows the pupil filter of FIG. 2 with differently set filter elements.

FIG. 3 shows a possible setting for the filter device in accordance with the invention according to FIG. 2. The same components as in FIG. 2 bear the same reference numerals. It is shown that the individual filter elements 103 project to a differently large extent into the cross section 106 of the bundle of illuminating rays in the plane in which the filter device is arranged (FIG. 3 shows cross section 106 more specifically as cross section 106.1). As is shown in FIG. 1, the bundle of illuminating rays passes through the illumination system from the light source to the plane in which the structure-bearing mask (e.g. the reticle) is arranged. In the present case, the bundle of illuminating rays has a circular cross-section 106 without being limited to the same. The circular cross-section has a circular surrounding edge 107.

The cross section 106 of the bundle of illuminating rays is shown in FIG. 3 with contour lines 109. The density of the contour lines 109 is a measure for the change of the light intensity in the cross section of the ray bundle. It applies in general in the illustrated figures that the narrower the light intensity, the faster the light intensity decreases.

A parabolic profile is obtained in the radial direction R in the case of a circular illumination φ.

By introducing rod-like filter elements into the illumination, the illumination is cut off more strongly in the direction of the circular arc and thus a rotation-symmetric illumination is achieved. The circularity of the cross section 106 of the beam path in FIG. 3 shall be regarded only in illustrating manner and not in a limiting manner, because others are also used in lithographic systems.

Figure 5:
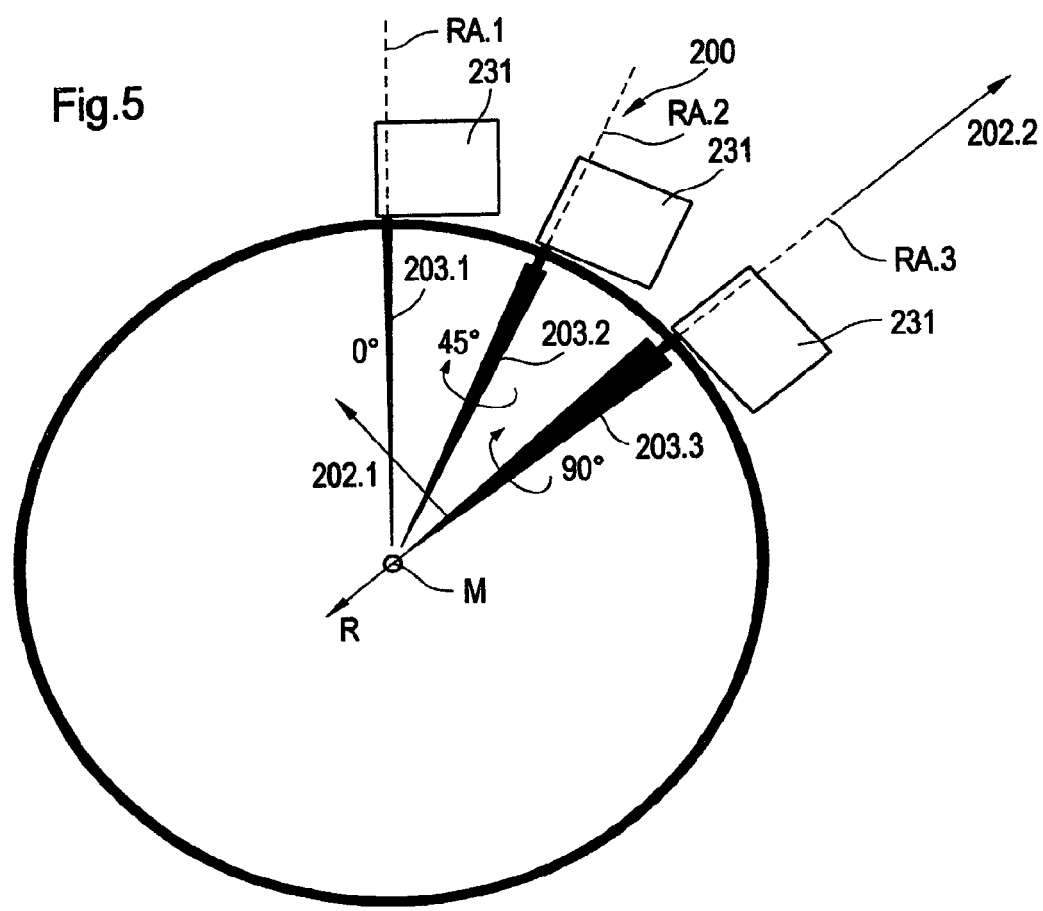
FIG. 5 shows a configuration of the filter device with radially oriented filter elements which are rotatable about their longitudinal axes.

FIG. 5 shows a further advantageous embodiment of the filter device 200 in accordance with the invention. In this case, the shadings in the beam path of the bundle of illuminating rays are not achieved by displacing the filter elements in the radial direction as in the filter device as shown in the FIGS. 2 to 4. Instead, this is achieved by controlling the orientation of the filter elements in the beam path of the bundle of illuminating rays. For this purpose, the filter elements 203.1, 203.2 and 203.3 of the filter device 200 are provided with an asymmetric configuration. Asymmetric configuration shall be understood in such a way that the part of a filter element 203.1, 203.2 and 203.3 projecting into the beam path has a different extension in a first direction 202.1 perpendicular to the radial direction R as compared with the second direction 202.2 which stands perpendicular to the first direction 202.1. This is shown to the filter element 203.3. The filter element 203.3 shows both the first direction 202.1 and the second direction 202.2. As is shown in FIG. 5, the filter element can be arranged in the form of a lamella. The lamella can be triangular and can taper with an acute angle. The setting of the individual filter elements 203.1, 203.2, 203.3 as shown in FIG. 5 is made by rotation of the filter element about a rotational axis RA.1, RA.2, RA.3 in which each filter element extends in the radial direction R towards the centerpoint M of the filter device 200. The different filter elements 203.1, 203.2, 203.3 are shown in FIG. 5 in different orientations. The minimal shadow casting is shown for a first filter element 203.1, which means that the projection exposure bundle meets the narrow side of the filter element 203.1. A second filter element 203.2 has been turned in comparison with the filter element 203.1 about 45° about the axis RA.2, as a result of which the shadow casting of the filter element 203.2 increases over the shadow casting of the filter element 203.1 in a plane which is arranged behind the pupil filter. Shadow casting shall be understood within the terms of this application as the shading occurring in a plane arranged directly behind the pupil filter. A third filter element 203.3 shows the full turning with an angle of 90° in the beam path, i.e. the maximum dimension of the filter element blocks the radiation and the maximum possible local shading is achieved.

FIG. 6 shows a three-dimensional view of an individual filter element 203, as shown in FIG. 5.

The filter elements 203 shows in FIG. 5 a triangular shape with the length L which is far longer than the width B and a thickness D. In accordance with the invention, the extension in a first direction which is designated in the present case as the X-direction is substantially larger than in a second direction which is designated in the present case as the Y-direction.

FIG. 6 also shows the local rotation axis RA. The filter element 203 can be rotated about the same for casting different shadows in a plane behind the pupil filter. The figure further shows the center M of the pupil filter and the actuating element which is configured here as electromotor 231 for moving the filter element 203 about the rotation axis RA.

A combination of a different configuration of the filter elements which can both be inserted radially into the beam path and can be oriented in the same is possible, i.e. a combination of the embodiments according to FIGS. 2 to 4 and 5 to 6. There is also the possibility to arrange the filter element not only as a solid body as shown in FIG. 6 but also to configure the same completely or in certain areas in a partly transparent way.

Such a filter element is shown in FIG. 7. The same components as in the filter element shown in FIG. 6 are designated with reference numerals which are increased by 100. A first region 305.2 is configured as a solid body and a second region 305.1 in a partly transparent way with rods 307.

The partial transparency can be produced by a sufficiently fine grating. Self-supporting gratings can be used in order to avoid reducing the partly transparent effect by an additional boundary as in the embodiment according to FIG. 7.

Figure 8A:
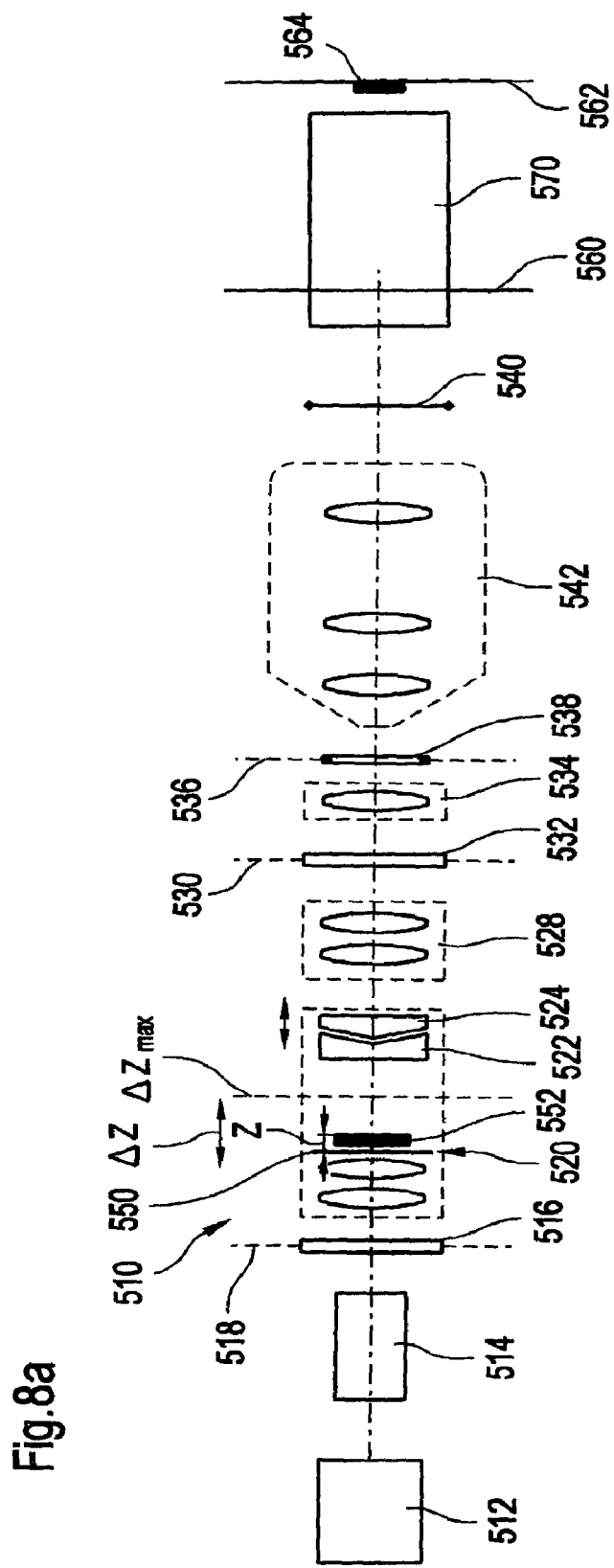
FIG. 8a shows the relevant optical components of a projection exposure system.

FIG. 8a shows an illumination system with a pupil filter 552 in accordance with the invention for the correction of asymmetry of the pupil illumination. Although the individual optical components are shown in more detail in the illumination system as shown in FIG. 8 as compared with FIG. 1, the illumination system is still shown in a highly simplified way.

The illumination system which is designated in total with reference numeral 510 includes a light source 512 which is configured as an excimer laser which generates monochromatic and strongly (but not completely) collimated light with a wavelength in the ultraviolet spectral range of 193 nm or 157 nm for example. The light source can emit polarized light.

The light generated by the light source 512 is expanded in a beam expander 514 into a rectangular and substantially parallel bundle of rays. The beam expander 514 can concern an adjustable minor arrangement for example. The now expanded light then passes through a first optical raster element 516 which can concern a diffractive optical element with a two-dimensional raster structure for example, as described in EP 0747772 A1. The first optical element is used to introduce entendue or so called light conductance value into the system. The laser beam is diffracted at each location of the diffractive optical element in a certain angular range which can lie between −3° and +3° for example. The angle radiation characteristics of the diffractive optical element is determined by the design of the diffractive surface structure on the diffractive optical element, so that a respective intensity distribution such as a dipolar or quadrupolar distribution is provided in a pupil plane 550 of a zoom-axicon objective. The light originating from the light source 512 is converted into a circular, annular or quadrupolar divergence distribution with said first optical raster element 516 for setting the divergence distribution. If an illumination is desired in the presence of a polarized light source such as a polarized laser, a depolarizer can be used in order to depolarize the laser light. Such a depolarizer consists for example of a first camera wedge made of a double-refracting material and a second camera wedge which compensates the angle introduced by the first camera wedge and is made of double-refracting or non-double-refracting material.

The first optical raster element 516 is arranged in an object plane 518 of a zoom-axicon objective 520 with which the distribution of illuminating angle can be changed and thus the illumination in the pupil can be formed further. For this purpose, the zoom-axicon objective 520 includes two axicon lenses 522, 524 which form a pair and are displaceable relative to each other.

The axicon lenses 522, 524 can include two conical lenses. By setting an air separation between these two conical lenses it is possible to achieve a shifting of the light energy to the outer regions. A hole or a region without light is produced in the middle around the optical axis (i.e. a so-called annular sectioning) in the illumination in the pupil plane.

The illumination system as shown in FIG. 8a includes a pupil plane 550 between the zoom-axicon objective and the axicon lenses 522, 524, which pupil plane is conjugated to the pupil plane 530 and conjugated to the exit pupil 560 of the illumination system 510. The pupil filter 552 in accordance with the invention is arranged in or close to this pupil plane 550 for correcting the asymmetry or asymmetric aberrations. The pupil filter for correcting asymmetry or asymmetric aberrations can also be arranged in or close to another pupil plane present in the system. In the present case, the pupil filter 552 has a distance Z to the pupil plane 550. The distance Z lies within the region $\Delta z$, with the region $\Delta z$ being defined on the one hand by the pupil plane 550 as the limit and on the other hand by the distance $\Delta z_{MAX}$. The distance $\Delta z_{MAX}$ is the distance at which the partial shadows of the individual filter elements overlap half at most in the circumferential region of the beam path.

Figure 8B:
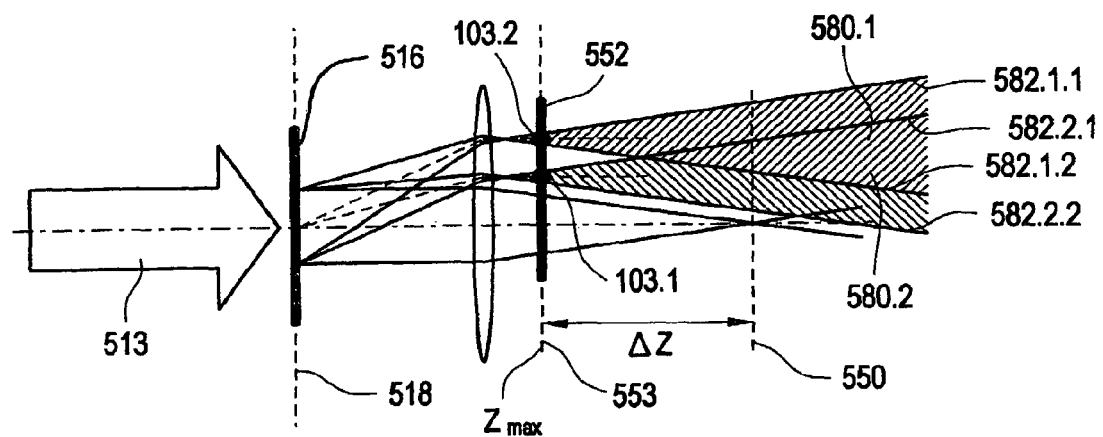

FIG. 8b shows this in closer detail. The same components as in FIG. 8a are designated with the same reference numerals. The bundle 513 of illuminating rays which starts out from the light source (not shown) and meets the first optical raster element 516 can clearly be recognized. The object plane 518 and the pupil plane 550 are shown. In the configuration as shown in FIG. 8b, the filter device (i.e. the pupil filter 552 in accordance with the invention which is shown by way of example in FIG. 3 and is designated there with reference numeral 100) is arranged before the pupil plane at a distance $\Delta z = Z_{MAX}$ in a plane 553. The distance $Z_{MAX}$ in which the filter device 552 can be arranged spaced from the pupil plane 550 is given in such a way that the partial shadows 580.1, 580.2 of the respective filter elements 103.1, 103.2 (FIG. 3) of the filter device 552 overlap half at most in the pupil plane 550. The marginal rays of the ray bundles 582.1 and 582.2 are designated with reference numerals 582.1.1, 582.1.2, 582.2.1, 582.2.2.

Figure 8C:
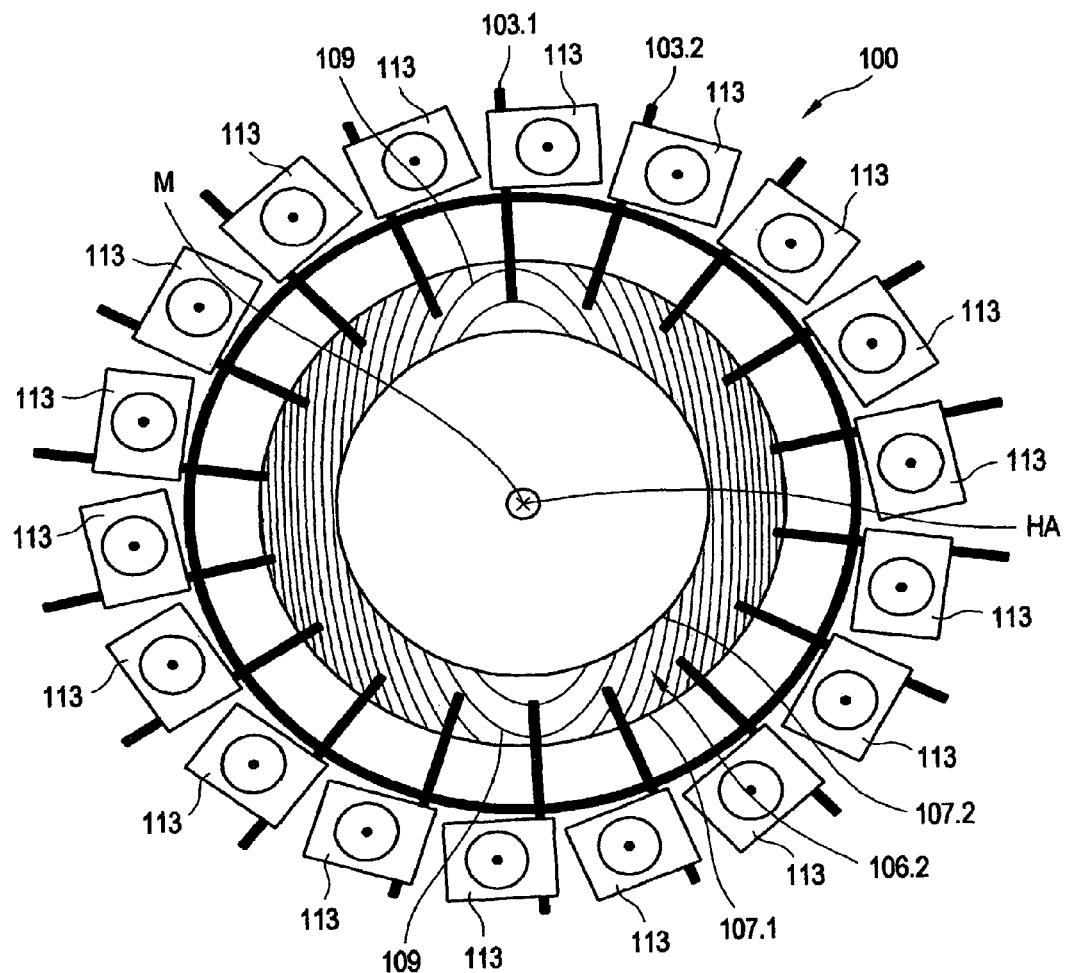
FIG. 8c shows the cross section of the pupil filter and the illumination in the plane in which the filter apparatus is arranged.

FIG. 8c shows the filter apparatus 100 which is identical to the filter apparatus 552 in FIGS. 8a and 8b in the plane 553 in a top view. The same components as in FIG. 3 are provided with the same reference numerals. The individual filter elements 103.1, 103.2 are shown. The figure also shows the cross section of the illumination 106.2. The illumination 106.2 as shown in FIG. 8c in the plane 553 is annular and is limited by the edges 107.1 and 107.2.

Figure 8D:
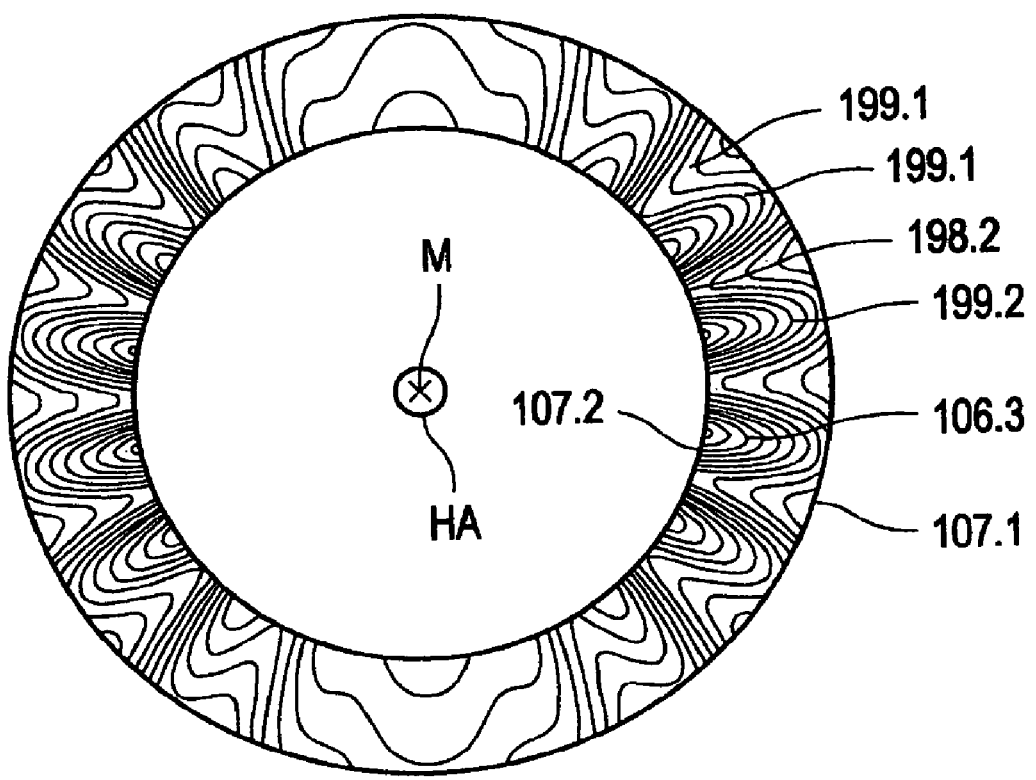
FIG. 8d shows the cross section of the illumination in the pupil plane.

When the plane 553 is arranged at a distance $\Delta z = Z_{MAX}$ relative to the pupil plane 550, the illumination 106.3 as shown in FIG. 8d is obtained in the pupil plane 550 in the cross section when using the illumination as shown in FIG. 8c. The effect of the partial shadows can clearly be seen, which leads to a flattening of the illumination in the distribution of intensity of the illumination 106.3 in the pupil plane with a number of minimums 198.1, 198.2 and maximums 199.1, 199.2 corresponding to the number of the filter elements 103.1, 103.2. The same components as in FIG. 8c are designated with the same reference numerals. $Z_{MAX}$ is designated as the distance which the partial shadows of the respective filter elements of the filter device overlap half at most in the pupil plane.

A second objective 528 is arranged in the beam path of the illuminating system according to FIG. 8a behind the zoom-axicon objective 520, which second objective projects the first pupil plane 550 onto a second pupil plane 530. A second optical raster element 532 is arranged in said second pupil plane 530 which may concern an optical element in the manner of a microlens array or honeycomb condenser. The second optical raster element 532 can be used to increase the divergence of the light coming from the second objective 528 in a purposeful way dependent on the direction, e.g. in order to achieve a rectangular illumination of the field plane 536. The filter element can be arranged before this field-generating raster element in order to achieve the most even effect on all field points.

As an alternative to the arrangement in or close to the pupil plane 550, the filter device 552 in accordance with the invention can also be arranged in or close to a second pupil plane 530, for example between the second objective 528 and the second pupil plane 530.

In FIG. 8a, the raster element 532 is the last optical element in the illumination system 510 which changes the entendue or the so called light conductance value. The entendue to be achieved at most by the illumination device 510 is thus reached behind the raster element 532. The entendue is only approximately 1% to 10% of the entendue between the first optical raster element 516 and the second optical raster element 532 which can be achieved behind the second optical raster element 532. This means that the light which passes through the second objective 528 is still collimated relatively strongly. The second objective 528 can therefore be configured in a very simple and inexpensive manner.

In the direction of the light propagation behind the second optical raster element 532, a third objective 534 is arranged in whose field plane 536 is arranged a known mask device 538 with adjustable knife edges. The mask device 538 determines the shapes of the region which is penetrated on a reticle 540 by projection light. The fourth objective 542 is used for projecting the area delimited by the knife edges into the mask plane 540.

Optionally, a glass rod (not shown) for beam homogenization can be inserted between the third objective 534 and the mask device 538.

The exit pupil of the entire illumination system 510 is designated in FIG. 8 with reference numeral 560. All pupil planes 530, 550 of the illumination system are conjugated planes to the exit pupil 560. The exit pupil 560 of the illumination system coincides with the entrance pupil of the projection objective 570 which projects the reticle 540 onto a light-sensitive object 564 in an object plane 562.

The light-sensitive object 564 can be a semiconductor wafer coated with a light-sensitive layer.

An objective as described in the published application DE 10151309 is used as a projection objective. The scope of disclosure of this application is hereby fully included in the present application; that is, the entire disclosure of published application DE 10151309 is expressly incorporated by reference herein.

Figure 9B:
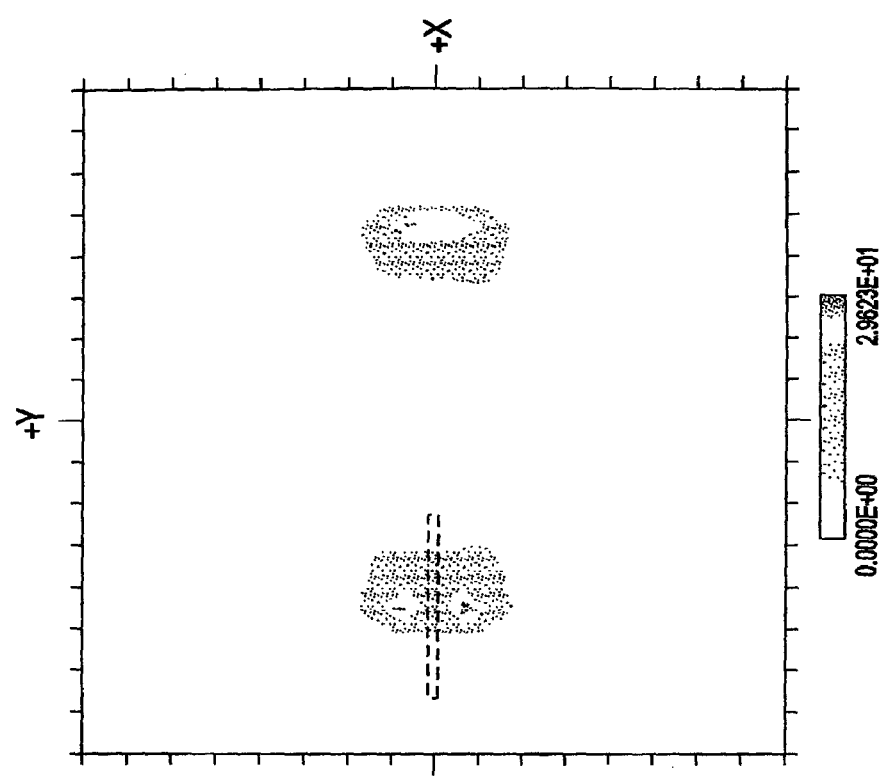
FIGS. 9a, 9b show the corrected and uncorrected illuminations of the exit pupil of a projection exposure system as shown in FIG. 8a for dipolar illumination.
Figure 9A:
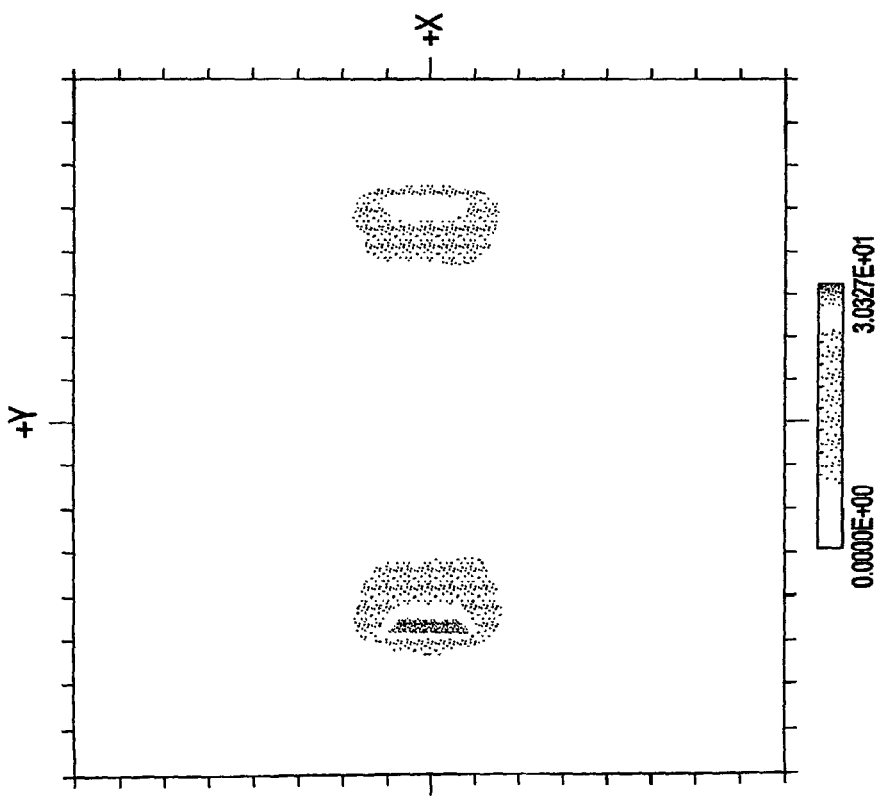

FIGS. 9a to 9b show an example for a dipole-like pupil illumination as occurs in an illumination system as shown in FIG. 8a in the exit pupil 560 which is conjugated to the pupil plane 550. FIG. 9a shows an asymmetric pupil illumination in the exit pupil 560 which has not yet been corrected by the filter element in accordance with the invention. FIG. 9b shows the position of a filter element inserted into the beam path, which filter element is located at a distance in accordance with the invention in front of the pupil plane and therefore only causes a partial shadow. Moreover, the thus produced local reduction in intensity is shown, which on its part produces the symmetry of the pupil illumination in the exit pupil 560. Notice must be taken that this concerns a strongly simplified example, because filter devices are possible in the present invention which include 10, possibly 20 and more individually controllable filter elements as shown in the FIGS. 2 to 7.

It is possible to position the filter device not in the pupil plane, but rather outside thereof, i.e. close to the pupil plane at a distance Δz. In this case partial shadow effects occur. As a result of an arrangement only close to the pupil plane, an only very low influence is taken on the shape of the pupil. On the other hand, the necessary brightness correction is achieved in order to correct the asymmetry of the pupils. An arrangement of the filter device in accordance with the invention close to a pupil plane is therefore possible. It is also possible not to provide all filter elements of a filter device in one plane. This means the individual filter elements can have a distance relative to each other in the direction the beam propagates. As a result of this measure, selected filter elements can be associated with a predetermined partial shadow area. In accordance with the further development of the invention, the filter elements can be displaced individually in the direction of the beam in order to have a variable possibility for adjustment of the partial shadow which is individual to each filter element.

Figure 10:
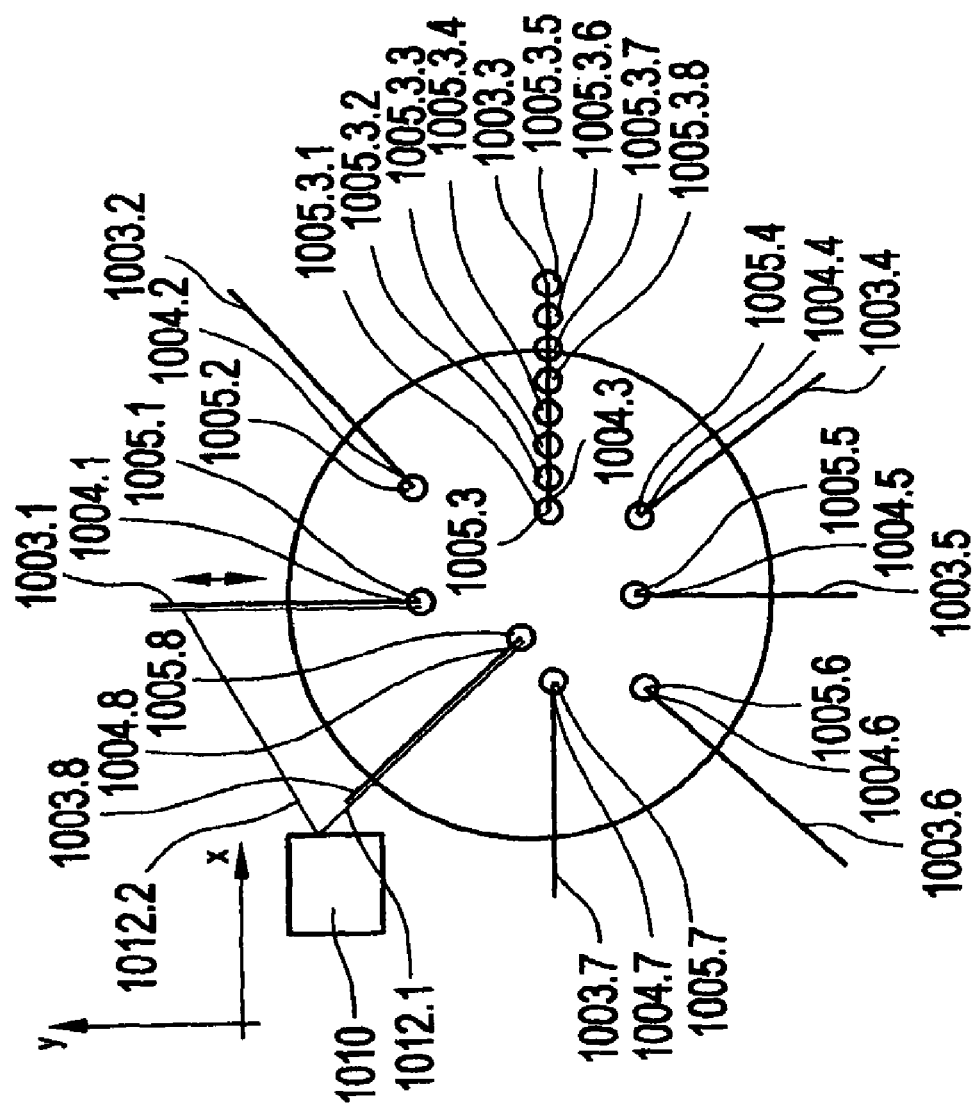
FIG. 10 shows an embodiment of a filter apparatus with quasi punctiform sensors applied to the individual rod-like elements.

FIG. 10 shows an embodiment of the invention with sensors arranged on the rod-like filter elements 1003.1, 1003.2, 1003.3, 1003.4, 1003.5, 1003.6, 1003.7, 1003.8.

In the rod-like filter elements 1003.1, 1003.2, 1003.3, 1003.4, 1003.5, 1003.6, 1003.7, 1003.8, the sensor is each arranged at the end 1004.1, 1004.2, 1004.3, 1004.4, 1004.5, 1004.6, 1004.7, 1004.8. In the rod-like filter element 1003.3, the entire rod-like filter element is provided with sensors 1005.3.1, 1005.3.2, 1005.3.3, 1005.3.4, 1005.3.5, 1005.3.6, 1005.3.7, 1005.3.8.

The sensors 1005.1, 1005.2, 1005.3.1, 1005.3.2, 1005.3.3, 1005.3.4, 1005.3.5, 1005.3.6, 1005.3.7, 1005.3.8, 1005.4, 1005.5, 1005.6, 1005.7, 1005.8 allow the measurement of intensity values in the illuminating beam path along the filter element in a location-resolved manner. The measured intensity values of the filter element allow drawing conclusions on the influence of the filter element on the illumination properties of ellipticity, telecentricity and transmission.

FIG. 10 further shows a control device 1010 which is configured as a personal computer and which in the illustrated case is connected by leads 1012.1, 1012.2 with the sensors 1005.1, 1005.8.

The intensity values measured with the sensors 1005.1, 1005.8 can be read into the control device 1010 and can be compared with the setpoint values of an illumination to be achieved in the field or pupil plane. These setpoint values then lead to the setpoint positions for the filter element to achieve the illumination in the field and/or pupil plane. The rod-like filter elements can then be brought to the respective setpoint position by the actuating elements (not shown in FIG. 10) as a result of this measurement.

The sensors 1005.1, 1005.2, 1005.3.1, 1005.3.2, 1005.3.3, 1005.3.4, 1005.3.5, 1005.3.6, 1005.3.7, 1005.3.8, 1005.4, 1005.5, 1005.6, 1005.7, 1005.8 can be configured as power sensors, e.g. photodiode sensors, for determining the intensity values.

In the rod-like filter element 1005.3, the rod-like filter element is covered completely with quasi punctiform power sensors. The sensors 1005.3.1, 1005.3.2, 1005.3.3, 1005.3.4, 1005.3.5, 1005.3.6, 1005.3.7, 1005.3.8 are configured as a line of photodiode sensors or CCD line. Such a configuration comes with the advantage that the measurement of the absorbed intensity which depends on the location of the rod-like filter element can occur in the filter element displaced into the illuminating beam path.

Since the power sensors are only required for determining the precise position of the filter element, it is provided for in a further developed embodiment in order to protect the sensors from permanent radiation by the same illuminating mode that the filter element can be rotated about its own axis in order to position the sensors in the shadow of the filter element after the performed measurement by turning the filter element by 180° and thus to protect the sensors from damage.

The illustrated filter apparatus according to FIG. 10 in which the rod-like filter elements are equipped with power sensors can, as described above, be used as a filter element for the illumination of the pupil plane. It is also possible to arrange the filter element in such a way that the illumination in a field plane is corrected by the pupil filter element in accordance with the invention.

In order to avoid any overdrive of the range of dynamics of the diode when using photodiode sensors as sensors, it can be provided for in an embodiment of the invention that there is a variable attenuator after the light source, e.g. the laser light source, and before the illuminating optics.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An illumination system, comprising:
 a filter device comprising a plurality of filter elements including a first filter element;
 an actuating device configured to displace the first filter element to different positions in a beam path of a bundle of illuminating rays passing through the illumination system during use,
 wherein:
  the filter device is arranged in a distance region Δz relative to a pupil plane of the illumination system;
  a first boundary of the distance region is given by the pupil plane;
  a second boundary of the distance region is given by a $\Delta Z_{MAX}$; and
 $\Delta Z_{MAX}$ is defined in so that, at or near the pupil plane, partial shadows of the filter elements overlap by at most half in a circumferential region of the beam.

2. The illumination system according to claim 1, wherein all the filter elements are configured to be inserted into the filter device to a different extent in a radial direction of the filter device.

3. The illumination system according to claim 1, wherein filter elements are rod-shaped.

4. The illumination system according to claim 1, wherein the filter elements have transparent regions.

5. The illumination system according to claim 1, wherein the filter elements have regions that comprise an unsupported net structure.

6. The illumination system according to claim 1, wherein the filter device has an outer circumference, and the plurality of filter elements is arranged substantially in a radial direction with reference to the outer circumference of the filter device.

7. The illumination system according to claim 6, wherein the filter device is movable in the radial direction.

8. The illumination system according to claim 6, wherein the filter device is configured to turn about an axis which is substantially radially oriented, and/or the filter device is displaceable along an axis in the axial direction.

9. The illumination system according to claim 1, wherein the filter device comprises more than 10 filter elements.

10. The illumination system according to claim 1, wherein the filter device is arranged in or close to a pupil plane of the illumination system.

11. The illumination system according to claim 1, wherein the dimensions of the filter elements are smaller in an azimuthal direction than a distance between two adjacent filter elements.

12. The illumination system according to claim 1, wherein a maximum shadow width of each filter element is 1% to 5% of a distance between two filter elements in a region of an outside circumference of the beam path.

13. The illumination system according to claim 11, wherein a lateral extension of the filter elements is 1% to 5% of a distance of the filter elements with respect to each other.

14. The illumination system according to claim 1, further comprising a first optical raster element arranged in the illumination system so that the optical raster element is in a light path from a light source to an object plane during use, wherein the filter device is arranged after the first optical raster element in the light path.

15. The illumination system according to claim 14, further comprising an objective element selected from the group consisting of a zoom objective and a zoom-axicon objective, wherein the filter device is arranged in the objective element.

16. The illumination system according to claim 14, further comprising a second optical raster element downstream of the first optical raster element along the light path.

17. The illumination system according to claim 16, wherein the filter device is arranged in the light path before the second optical raster element.

18. The illumination system according to claims 14, further comprising a variable attenuator arranged in the light path.

19. The illumination system according to claim 18, further comprising illuminating optics, wherein the variable attenuator is arranged in the light path before the illuminating optics.

20. A system, comprising:
the illumination system of claim 1,
wherein the system is a lithographic system.

21. A method, comprising:
using a lithographic system to produce microelectronic or micromechanical components,
wherein the lithographic system comprises the illumination system of claim 1.

* * * * *

UNITED STATES PATENT AND TRADEMARK OFFICE
CERTIFICATE OF CORRECTION

PATENT NO. : 8,025,427 B2  Page 1 of 1
APPLICATION NO. : 12/855305
DATED : September 27, 2011
INVENTOR(S) : Manfred Maul It is certified that error appears in the above-identified patent and that said Letters Patent is hereby corrected as shown below:

Column 2,
Line 36, Delete "includes" and insert --include--

Column 5,
Line 2, Delete "quadropolar" and insert --quadrupolar--

Column 8,
Line 16, Delete "103.1,103.2." and insert --103.1, 103.2.--

Column 10,
Line 43, Delete "minor" and insert --mirror--

Signed and Sealed this
Thirteenth Day of December, 2011

David J. Kappos
*Director of the United States Patent and Trademark Office*